United States Patent
Shen et al.

(10) Patent No.: US 10,153,427 B1
(45) Date of Patent: Dec. 11, 2018

(54) MAGNETIC TUNNEL JUNCTION (MTJ) PERFORMANCE BY INTRODUCING OXIDANTS TO METHANOL WITH OR WITHOUT NOBLE GAS DURING MTJ ETCH

(71) Applicant: Headway Technologies, Inc., Milpitas, CA (US)

(72) Inventors: Dongna Shen, San Jose, CA (US); Yu-Jen Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/856,129

(22) Filed: Dec. 28, 2017

(51) Int. Cl.
| | |
|---|---|
| H01L 21/00 | (2006.01) |
| H01L 43/12 | (2006.01) |
| H01L 21/02 | (2006.01) |
| H01L 21/3065 | (2006.01) |
| H01L 21/311 | (2006.01) |
| H01L 21/3213 | (2006.01) |
| H01L 43/08 | (2006.01) |

(52) U.S. Cl.
CPC ........ *H01L 43/12* (2013.01); *H01L 21/02071* (2013.01); *H01L 21/3065* (2013.01); *H01L 21/31122* (2013.01); *H01L 21/32136* (2013.01); *H01L 43/08* (2013.01)

(58) Field of Classification Search
CPC ........... H01L 21/3065; H01L 21/31122; H01L 21/32136; H01L 21/02071; H01L 43/12
USPC .......................................................... 438/3
See application file for complete search history.

(56) References Cited

U.S. PATENT DOCUMENTS

| | | |
|---|---|---|
| 6,395,621 B1 | 5/2002 | Mizushima et al. |
| 6,806,096 B1 | 10/2004 | Kim et al. |
| 6,984,529 B2 | 1/2006 | Stojakavlc et al. |
| 7,001,783 B2 | 2/2006 | Costrini et al. |
| 7,060,194 B2 | 6/2006 | Kodaira et al. |
| 7,169,654 B2 | 1/2007 | Zia et al. |
| 7,471,445 B2 | 12/2008 | Pan |
| 7,593,193 B2 | 9/2009 | Inomata et al. |
| 7,696,551 B2 | 4/2010 | Xiao et al. |
| 8,450,119 B2 | 5/2013 | Torng et al. |
| 8,716,072 B2 | 5/2014 | Bangsaruntip et al. |
| 8,722,543 B2 | 5/2014 | Belen et al. |
| 8,981,507 B2 | 3/2015 | Takahashi et al. |
| 9,166,154 B2 | 10/2015 | Satoh et al. |
| 9,269,894 B2 | 2/2016 | Mudivarthi et al. |

(Continued)

*Primary Examiner* — David S Blum
(74) *Attorney, Agent, or Firm* — Saile Ackerman LLC; Stephen B. Ackerman (57) ABSTRACT

A process flow for forming magnetic tunnel junctions (MTJs) with minimal sidewall residue and reduced low tail population is disclosed wherein a pattern is first formed in a hard mask that is an uppermost MTJ layer. Thereafter, the hard mask pattern is etch transferred through the underlying MTJ layers including a reference layer/tunnel barrier/free layer stack. The etch transfer may be completed in a single RIE step based on a first flow rate of $O_2$ and a second flow rate of an oxidant such as $CH_3OH$ where the $CH_3OH/O_2$ ratio is at least 7.5:1. The RIE may also include a flow rate of a noble gas. In other embodiments, a chemical treatment with an oxidant such as $CH_3OH$, and a volatilization at 50° C. to 450° C. may follow an etch transfer through the MTJ stack when the ion beam etch or plasma etch involves noble gas ions.

22 Claims, 5 Drawing Sheets

(56) References Cited

U.S. PATENT DOCUMENTS

| | | |
|---|---|---|
| 9,275,713 B2 | 3/2016 | Guo |
| 9,362,490 B1 | 6/2016 | Xiao |
| 2003/0073251 A1 | 4/2003 | Ning |
| 2005/0277207 A1 | 12/2005 | Costrini et al. |
| 2007/0215911 A1 | 9/2007 | Torng et al. |
| 2009/0078927 A1 | 3/2009 | Xiao et al. |
| 2009/0159563 A1 | 6/2009 | Jung |
| 2009/0261437 A1 | 10/2009 | Kang et al. |
| 2014/0235056 A1 | 8/2014 | Guha et al. |
| 2016/0351798 A1 | 12/2016 | Shen et al. |
| 2018/0158867 A1* | 6/2018 | Kim ................. H01L 27/228 |

* cited by examiner

MAGNETIC TUNNEL JUNCTION (MTJ) PERFORMANCE BY INTRODUCING OXIDANTS TO METHANOL WITH OR WITHOUT NOBLE GAS DURING MTJ ETCH

RELATED PATENT APPLICATIONS

This application is related to filed May 15, 2017, Ser. No. 15/595,484; and filed Aug. 3, 2017, Ser. No. 15/668,113, which are assigned to a common assignee and herein incorporated by reference in their entirety.

TECHNICAL FIELD

The present disclosure relates to a method of reducing MTJ sidewall damage and residue during an etch process that transfers a mask pattern through a MTJ stack of layers thereby generating an array of MTJ nanopillars with improved magnetoresistive ratio (DRR) and other magnetic properties including a decreased low tail population in a plot of DRR vs. minimum resistance.

BACKGROUND

A MTJ memory element is also referred to as a MTJ nanopillar or MTJ, and is a key component in magnetic recording devices, and in memory devices such as magnetoresistive random access memory (MRAM) and spin torque transfer (STT)-MRAM. An important step in fabricating an array of MTJs is etch transfer of a pattern in an overlying hard mask through a MTJ stack of layers to form an array of MTJs with a critical dimension (CD) that in state of the art devices is substantially less than 100 nm from a top-down view. The etch transfer process typically involves a plurality of etch steps involving reactive ion etch (RIE) and/or ion beam etch (IBE) and stops on a substrate which is generally a bottom electrode.

A MTJ stack of layers includes two ferromagnetic layers called the free layer (FL) and reference layer (RL), and a dielectric layer (tunnel barrier) between the FL and RL. The RL has a fixed magnetization preferably in a perpendicular-to-plane direction (perpendicular magnetic anisotropy or PMA) while the FL is free to rotate to a direction that is parallel (P) or anti-parallel (AP) to the RL magnetization direction thereby establishing a "0" or "1" memory state for the MTJ. The magnetoresistive ratio is expressed by dR/R (or DRR) where dR is the difference in resistance between the two magnetic states ($R_{AP}-R_P$) when a current is passed through the MTJ, and $R=R_P$ is the minimum resistance value.

The bottommost MTJ layer is usually a non-magnetic seed layer that promotes uniform growth in overlying layers, and enhances PMA in the overlying RL or FL. A capping layer such as Ta is generally formed as the uppermost MTJ layer and serves as a protective layer during subsequent physical and chemical etches. Thus, a single etch transfer process through the MTJ stack of layers is challenging since there are a variety of materials (magnetic alloys, non-magnetic metals, and dielectric films) that each have a different etch rate when subjected to IBE with Ar or to conventional $CH_3OH$ based RIE. In particular, methanol RIE causes chemical and plasma damage on MTJ sidewalls although there is minimal redeposition of etched material on the sidewalls. On the other hand, IBE produces no chemical damage and leaves minimal plasma damage, but results in a high degree of redeposited material on MTJ sidewalls. In both RIE and IBE, a so-called dead layer is formed on MTJ sidewalls and is comprised of one or both of redeposited material and damaged material including oxidized portions of MTJ layers. When the dead layer includes one or more metals from the hard mask or another MTJ layer, or from the bottom electrode, and is formed on the tunnel barrier, an electrical shunt or "short" may easily occur and render the device unusable.

Figure 1:
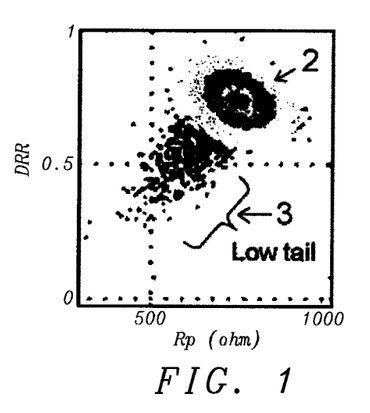
FIG. 1 is a plot of DRR vs. $R_P$ for a plurality of MTJs on a STT-MRAM chip, and shows a "low tail" population having lower DRR.

An electrical shunt is often observed as a "low tail" population in a plot of DRR vs. resistance ($R_P$) as shown in FIG. 1. The cluster 3 of data points outside the main population 2 and spreading toward zero DRR and zero $R_P$ is defined as the "low tail". MTJs with this low tail population are undesirable for STT-MRAM applications since they have a small DRR as well as low $R_P$. This result occurs because as the electrical short (shunt) becomes larger, more current passes through the shunt pathway and does not contribute to tunnel magnetoresistance.

Current technology does not provide a single etch solution for transferring a hard mask pattern through an entire stack of layers without either a substantial redeposition of one or more MTJ materials on the MTJ sidewalls, or significant damage to the sidewalls. In any case, removal of material from the sidewalls requires one or more extra steps that reduce throughput and add cost. Moreover, damaged sidewalls are difficult to repair and often lead to reduced yield and therefore higher cost per unit of acceptable product. Therefore, a new method for etching a MTJ stack of layers in a single etch process is needed for higher throughput and lower cost, and the method must maintain or preferably improve magnetic properties including increasing DRR and decreasing the low tail population in the resulting plurality of MTJs. Furthermore, a process flow for etching MTJ sidewalls is desired that substantially reduces sidewall residue for devices with a diameter (CD) around 60 nm or less.

SUMMARY

One objective of the present disclosure is to provide a method for etching all layers in a MTJ stack below the hard mask with a single etch step that leaves minimal residue thereby reducing the occurrence of electrical shunting.

A second objective of the present disclosure is to provide a process flow for MTJ etching that satisfies the first objective and substantially reduces sidewall damage and associated edge effects compared with conventional methanol based RIE thereby enabling improved device performance including higher DRR, especially for MTJ nanopillars with critical dimensions ≤60 nm.

According to a preferred embodiment, these objectives are achieved with a MTJ stack of layers having at least a reference layer, free layer, a tunnel barrier between the free layer and reference layer, and an uppermost hard mask. In some embodiments, a seed layer is employed as the bottommost MTJ layer. A pattern comprising a plurality of island features with the desired critical dimension for the eventual MTJ nanopillars is first defined in a photoresist mask layer above the hard mask layer. Preferably, there is a bottom anti-reflective coating (BARC) or a dielectric anti-reflective coating (DARC) between the hard mask and photoresist mask layer that has better resistance to subsequent etch processes than the photoresist mask. The pattern is etch transferred through the BARC or DARC by a first RIE or IBE step, and is then transferred through the hard mask by continuing the first etch step, or by performing a second RIE step comprised of a fluorocarbon or chlorocarbon gas, or by a second IBE step.

According to one embodiment of the present disclosure, the pattern of island features is then transferred through the remaining MTJ layers by a RIE step comprising a noble gas, oxygen, and a chemical (oxidant) such as methanol, ethanol, ammonia, or a combination of CO and $NH_3$. In particular, Ar ions or the like provide a physical component to the etch while oxygen and the one or more chemicals provide a plasma component for chemical etching. As a result, noble gas ions or plasma substantially minimize chemical damage to the MTJ sidewalls, and redeposition of etched residue on the MTJ sidewalls is significantly reduced because of plasma generated from oxygen and the chemical component. Etch conditions may be optimized to yield substantially less sidewall damage and sidewall residue than in conventional methanol based RIE. In a preferred embodiment, the ratio of $CH_3OH$/oxygen is >7.5:1. In alternative embodiments, the $CH_3OH$/oxygen ratio is ≥1:1, or the noble gas flow may be reduced to zero while maintaining the ≥7.5:1 methanol/oxygen ratio.

Thereafter, an encapsulation layer is deposited on the resulting MTJs, and then a chemical mechanical polish (CMP) process or an alternative planarization method is performed to remove all layers above the hard mask. The CMP process forms a hard mask top surface that is coplanar with the surrounding encapsulation layer. From a top-down view, the MTJs form an array of circular or elliptical shapes, for example.

In a second embodiment, a process sequence is used to transfer the pattern of island shapes in the hard mask through the remaining MTJ layers thereby generating a plurality of MTJs that has minimal sidewall damage and residue. A first process flow comprises an IBE step and then a separate chemical treatment to convert non-volatile residue on MTJ sidewalls into a volatile residue. Thereafter, a second IBE step, plasma sputter etch step, or a thermal treatment is employed to remove the volatile residue. A second process flow includes a RIE step and then a separate chemical treatment wherein the chemical may be applied without plasma to transform any sidewall residue into a volatile form. Next, an optional IBE step, plasma sputter etch step, or thermal treatment is used to remove the volatile residue. In other embodiments, RIE is alternated with IBE before the optional chemical treatment, and optional volatilization step.

DETAILED DESCRIPTION

The present disclosure is a method of etching a MTJ stack of layers wherein all layers below the hard mask are removed with a single etch process comprised of a gas flow that includes at least oxygen and a second oxidant such as methanol to form a MTJ with sidewalls that have substantially less sidewall damage compared with conventional methanol based RIE, and minimal sidewall residue (dead layer). An alternative process sequence is provided where the physical and chemical etchants are alternated, or are in separate steps and followed by a chemical treatment and an optional volatilization process to achieve improved MTJ performance. Although only one MTJ is depicted in the drawings with cross-sectional views, one skilled in the art will appreciate that a plurality of MTJs is formed in a typical memory device pattern. A process is defined as a method that includes one or more steps, and a sequence or process flow according to the present disclosure refers to two or more processes in succession.

In related patent application Ser. No. 15/595,484, we disclosed a RIE step comprising a mixture of a noble gas and an oxidant such as $CH_3OH$ to improve DRR to pattern a MTJ stack of layers and thereby reduce the number of resulting MTJs in a low tail population. Also, in related patent application Ser. No. 15/668,113, we described a similar RIE step with Ar and $CH_3OH$ to improve etch selectivity when patterning a MTJ stack of layers. Now we have discovered that further improvement in MTJ performance is realized with the addition of a limited amount of oxygen to the noble gas/oxidant gas mixture employed during MTJ etching. In some embodiments, the noble gas may be omitted to realize improved results in the MTJ etch.

Figure 2:
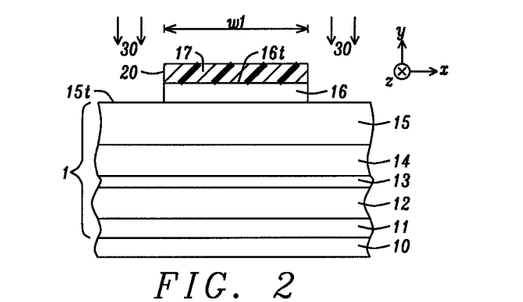
FIG. 2 is a cross-sectional view of a MTJ stack of layers on which a photoresist pattern has been formed, and shows ions used to transfer the pattern through an underlying BARC or DARC during an etch sequence of the present disclosure.

Referring to FIG. 2, a MTJ stack of layers 1 that will eventually become a plurality of MTJs in a MRAM or STT-MRAM array is shown from a cross-sectional view. The y-axis is perpendicular to the planes of the layers in the MTJ stack. There is a substrate 10 that in one embodiment is a bottom electrode in a memory device. The bottom electrode may be a multilayer structure and is typically embedded in a dielectric layer (not shown).

MTJ stack 1 is formed on substrate 10 and in the exemplary embodiment has a bottom spin valve configuration wherein a seed layer 11, pinned or reference layer 12, tunnel barrier 13, free layer 14, and hard mask 15 are sequentially formed on the substrate. Each of the reference layer and free layer preferably have PMA with a magnetization aligned in a positive or negative y-axis direction. In other embodiments, at least one additional layer may be included in the aforementioned MTJ stack such as a Hk enhancing (metal oxide) layer (not shown) between the free layer and hard mask that enhances PMA in the free layer. In other embodiments, the MTJ stack may comprise well known top spin valve or dual spin valve configurations and provide the same benefits described herein following a MTJ etch process according to the present disclosure.

The seed layer may be comprised of one or more of NiCr, Ta, Ru, Ti, TaN, Cu, Mg, or other materials typically employed to promote a smooth and uniform grain structure in overlying layers. Reference layer 12 may have a synthetic anti-parallel (SyAP) configuration represented by AP2/Ru/AP1 where an antiferromagnetic coupling layer made of Ru, Rh, or Ir, for example, is sandwiched between an AP2 magnetic layer and an AP1 magnetic layer (not shown). The AP2 layer, which is also referred to as the outer pinned layer is formed on the seed layer while AP1 is the inner pinned layer and typically contacts the tunnel barrier. AP1 and AP2 layers may be comprised of CoFe, CoFeB, Co, or a combination thereof. In other embodiments, the reference layer may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and the tunnel barrier layer. Note that one or both of the AP1 and AP2 layers in a SyAP configuration may comprise a laminated stack.

Each of the tunnel barrier layer 13 and optional Hk enhancing layer is preferably a metal oxide that is one or more of MgO, TiOx, AlTiO, MgZnO, $Al_2O_3$, ZnO, ZrOx, HfOx, or MgTaO. More preferably, MgO is selected as the tunnel barrier layer because MgO provides the highest magnetoresistive ratio, especially when sandwiched between two CoFeB layers, for example.

The free layer 14 may be Co, Fe, CoFe, or an alloy thereof with one or both of B and Ni, or a multilayer stack comprising a combination of the aforementioned compositions. In another embodiment, the free layer may have a non-magnetic moment diluting layer such as Ta or Mg inserted between two CoFe or CoFeB layers that are ferromagnetically coupled. In an alternative embodiment, the free layer has a SyAP configuration such as FL1/Ru/FL2 where FL1 and FL2 are two magnetic layers that are antiferromagnetically coupled, or is a laminated stack with inherent PMA described previously with respect to the reference layer composition.

The hard mask 15 is also referred to as a capping layer and is typically comprised of one or more of Ta, Ru, TaN, Ti, TiN, and W. It should be understood that other hard mask materials including MnPt may be selected in order to provide high etch selectivity relative to underlying MTJ layers during an etch process that forms MTJ nanopillars with sidewalls that stop on the bottom electrode. All layers in the MTJ stack may be deposited in a DC sputtering chamber of a sputtering system such as an Anelva C-7100 sputter deposition system that includes ultra high vacuum DC magnetron sputter chambers with multiple targets and at least one oxidation chamber. Usually, the sputter deposition process involves an argon sputter gas and a base pressure between $5 \times 10^{-8}$ and $5 \times 10^{-9}$ torr.

Once all of the layers 11-15 are formed, MTJ stack 1 may be annealed by heating to a temperature between about 360° C. to 400° C. for a period of up to a plurality of hours to grow a bcc structure in the reference layer, free layer, and tunnel barrier layer thereby enhancing PMA in the reference layer and free layer. The matching crystal structure in the aforementioned layers is also believed to improve the magnetoresistive ratio (DRR) in the resulting MTJs.

As a first step in the MTJ patterning process according to the present disclosure, a BARC or DARC layer 16, and a photoresist layer 17 are sequentially coated on the top surface 15t of the hard mask. BARC or DARC with top surface 16t has a refractive index that minimizes reflection of light during the subsequent patternwise exposure thereby enabling more uniform island shapes with less CD variation to be formed in the photoresist layer. Next, a conventional patternwise exposure and developer sequence is employed to form a pattern in the photoresist layer that comprises a plurality of islands with sidewall 20. As indicated later by a top-down view in FIG. 9, the islands are in an array with a plurality of rows and columns. However, only one island is shown in FIG. 2 in order to simplify the drawing. Each island has a critical dimension w1 that in some embodiments is between 60 nm and 100 nm, and in other embodiments is from 10 nm to 60 nm that corresponds to the CD required in state of the art memory devices. Note that some devices are circular such that w1 is formed in both of the x-axis and z-axis directions. However, the top-down shape of island 17 may be an ellipse or a polygon such that the z-axis dimension is different from the x-axis dimension.

In the initial etch process 30 that may be an IBE with a noble gas that is one or more of Ar, Kr, Xe, or Ne, or may comprise RIE with a fluorocarbon or chlorocarbon gas, the island shape in photoresist layer 17 is transferred through the BARC or DARC layer 16. Accordingly, sidewall 20 now extends from a top surface of the photoresist layer to a top surface 15t of the hard mask 15, and CD w1 is duplicated in the DARC or BARC layer. The photoresist layer may then be removed with a conventional method, or is etched away during subsequent etch processes.

Figure 3:
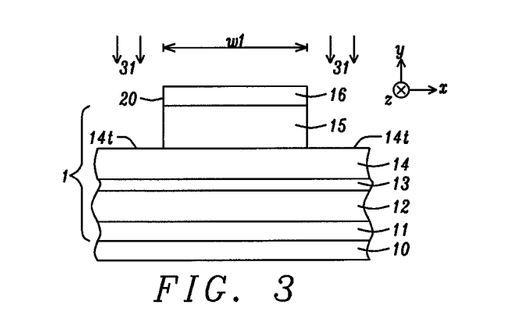
FIG. 3 is a cross-sectional view of a MTJ stack in FIG. 2 after an etch process transfers the pattern through the uppermost hard mask MTJ layer according to an embodiment of the present disclosure.

Referring to FIG. 3, a second etch process 31 is performed to transfer the island shape with sidewall 20 and CD w1 through the hard mask 15. In some embodiments, a second IBE with a noble gas, or a second fluorocarbon or chlorocarbon based RIE may be used. Moreover, the second IBE or RIE may include oxygen. However, in other embodiments, the present disclosure anticipates that the conditions employed for etch process 31 are essentially the same as applied in etch process 30 such that the etch transfer through the hard mask may be a continuation of the etch transfer through DARC or BARC layer 16. In other words, etch process 30 in FIG. 2 may be continued until stopping on top surface 14t of the free layer. As mentioned earlier, the etch transfer process through the hard mask is likely to remove any remaining photoresist layer 17 because the etch rate through the latter is generally high relative to the hard mask, and the hard mask may be substantially thicker than the remaining photoresist layer once etch process 30 clears the exposed DARC or BARC layer 16. In some embodiments, a passivation step comprised of applying oxygen plasma or flowing oxygen into the process chamber, or simply unloading the wafer to atmosphere immediately after the second RIE or IBE is completed, is performed to generate a smoother sidewall 20.

In the embodiments described herein, an IBE process comprises rotating the work piece (wafer) on which the MTJ stack of layers is formed. Moreover, the incident or penetration angle of noble gas ions directed at the wafer surface may be between 0° and 90°. IBE may be employed in one or more of hard mask etching, MTJ etching, cleaning, and volatilization steps described in later sections. On the other hand, RIE is used only for hard mask or MTJ etching, involves a chemical reactant and stationary wafer, and the resulting plasma is limited to a 90° direction that is orthogonal to the wafer surface. According to the present disclosure, a plasma sputter etch is employed only for volatilization or cleaning steps, comprises a noble gas, and is also limited to a 90° direction (orthogonal to wafer surface).

Figure 4:
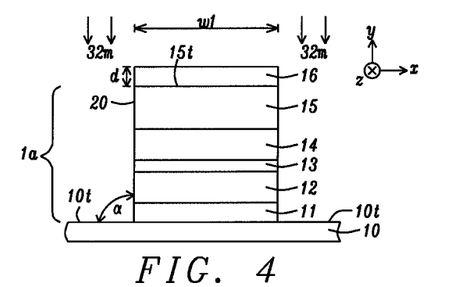
FIG. 4 is cross-sectional view of a MTJ after an etch that combines physical and chemical components is used to transfer the hard mask pattern through the underlying MTJ stack according to an embodiment described herein.

Referring to FIG. 4, a key feature according to a first embodiment of the present disclosure is a single RIE step 32m that effectively transfers the island shape in the hard mask through all of the underlying MTJ layers 11-14 thereby forming MTJ 1a. Etch step 32m comprises a physical component represented by noble gas ions or plasma, and a chemical component comprising ions or plasma of oxygen and a chemical species that are generated with reactive ion etch conditions. The noble gas is one of Ar, Kr, Ne, and Xe. Thus, a noble gas, oxygen, and one or more chemicals including methanol, ethanol, $H_2O_2$, $H_2O$, $N_2O$, $NH_3$, and CO are fed into an etch chamber while a plasma is induced with a RF power between 600 Watts and 3000 Watts at a temperature from room temperature up to 100° C. It should be understood that the RF power applied to an upper electrode may be different than the RF power applied to a lower electrode (not shown) in a RIE chamber. The resulting ions and plasma in a preferred embodiment are directed orthogonal to the top surface of the substrate along the y-axis direction. As a result, sidewall 20 is a continuous surface extending from a top surface 15t of hard mask 15 to top surface 10t of the bottom electrode.

In some embodiments, the noble gas may be omitted such that RIE step 32m comprises oxygen and the chemical component. For example, with a RIE based on $CH_3OH$ and oxygen, the feed ratio should be $\geq 7.5:1$ $CH_3OH:O_2$ for DRR improvement and a reduced low tail population. If additional oxygen is added such that the $CH_3OH:O_2$ ratio is between 1:1 and 7.5:1, there may be a degradation in MTJ performance or no change in DRR or low tail population compared with a MTJ etch based on $CH_3OH$ and Ar that serves as a reference from related patent application Ser. No. 15/595,484.

In a preferred embodiment, the sidewall 20 is substantially vertical such that CD w1 is substantially maintained in all MTJ layers 11-15. Note that sidewall angle $\alpha$ tends to become more vertical as the methanol (or alternative chemical) and oxygen content increases in the gas mixture of step 32m. For example, angle $\alpha$ may be proximate to 70° when noble gas content is 100% but becomes substantially equal to 80° with a noble gas content around 50% or greater. Here, the term "content" refers to flow rate ratio. Therefore, a 50:50 flow rate ratio of noble gas:chemical/$O_2$ indicates a 50% noble gas content and 50% chemical/$O_2$ content in the RIE gas mixture. We have surprisingly found the combined physical and chemical etching provides for a sidewall that has substantially reduced sidewall damage compared with conventional methanol based RIE, and minimal residue. Preferably, the chemical component has a flow rate substantially greater than the flow rate of $O_2$. When a noble gas is included in the RIE gas mixture, the noble gas has a flow rate substantially greater than that of $CH_3OH$ or an alternative chemical in order to achieve improved MTJ performance over a RIE step based on $CH_3OH$ and Ar.

In the exemplary embodiment, a thickness d of the DARC or BARC layer 16 remains after the etch transfer. However, depending on the initial thickness and composition of layer 16, and the etch conditions, the DARC or BARC layer may be completely removed during etch step 32m such that hard mask top surface 15t is exposed. Therefore, a hard mask 15 is advantageously selected that has a high etch rate selectivity to the underlying MTJ layers so that a substantial thickness of hard mask remains after etch step 32m.

Figure 7:
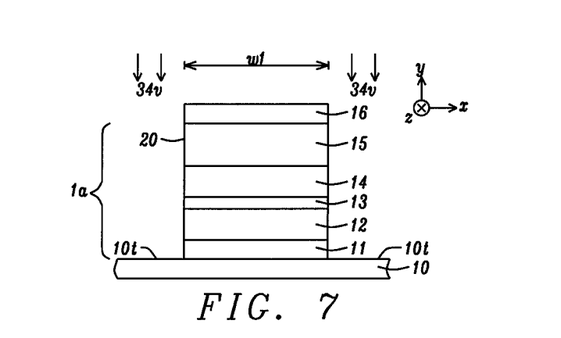
FIG. 7 is a cross-sectional view of the MTJ in FIG. 6 after a volatilization step involving IBE, plasma sputter etch, or thermal treatment is used to remove the volatile residue according to an embodiment of the present disclosure.

An optional volatilization step 34v illustrated in FIG. 7 may be employed to remove any residue that has accumulated on sidewall 20 at the end of etch step 32m. The volatilization preferably comprises an IBE or plasma sputter etch with noble gas wherein Ar+ ions or ions of Kr, He, or Ne that are generated with a RF or DC power are directed orthogonally or with a certain penetration angle toward a top surface 10t of the substrate. The wafer (not shown) on which MTJ 1 is formed is typically rotated during IBE or is static for a plasma sputter etch during step 34v. In another embodiment, the volatilization is a thermal treatment in a noble gas, vacuum, or oxidant atmosphere at a temperature from 50° C. to 450° C.

According to a second embodiment shown in FIGS. 5a-5b, FIG. 6, and FIG. 7, the present disclosure encompasses a process flow where the chemical component ($O_2$ and $CH_3OH$) in the combined etch of the first embodiment is separated from the physical etch component. One or two optional steps related to a chemical treatment (FIG. 6) and a volatilization (FIG. 7) may be included to produce MTJ 1a with minimal residue and with substantially reduced sidewall damage compared with conventional methanol based RIE in the prior art.

Figure 5A:
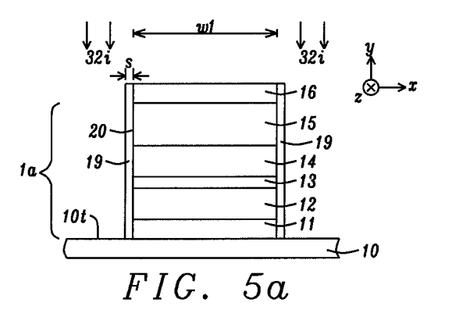
FIG. 5a is a cross-sectional view of the MTJ stack in FIG. 3 after an ion beam etch transfers the hard mask pattern and causes residue to form on MTJ sidewalls.

In FIG. 5a, an IBE 32i with noble gas is employed to remove portions of MTJ layers 11-14 that are not protected by the DARC or BARC layer 16, and by hard mask 15. As a result, MTJ 1a is generated but has a dead layer with thickness "s" comprised of non-volatile residues 19 on sidewall 20. Thereafter, in FIG. 6, a chemical treatment 33 may be performed to convert the non-volatile residues to volatile residues 19x on the sidewall. Although not bound by theory, it is believed the chemical treatment converts metal residue such as Ta to an oxide thereof wherein the oxide is more volatile than the metal residue. The chemical treatment comprises one or more of methanol, ethanol, and ammonia, and a temperature between room temperature and 150° C. The chemical treatment is performed in a chamber within an Anelva mainframe or the like, or may be conducted in a stand alone process tool outside a mainframe although the latter option slows throughput. In some cases, the one or more chemicals are injected into the chamber where the substrate is held in place. Moreover, oxygen may be added to the chemical treatment chamber to enhance the rate of oxidation of the non-volatile residue 19. Alternatively, a plasma may be generated from the one or more chemicals with RIE conditions in an etch chamber. Preferably, the applied RF power is sufficiently low so that no significant damage occurs to MTJ sidewall 20. For example, the RF power may be maintained between 100 Watts and 800 Watts.

Referring to FIG. 7, volatilization step 34v may be performed to remove the volatile residue 19x and comprises an IBE or a plasma sputter etch with Ar or another noble gas flow, or a thermal treatment in an etch chamber at a temperature between 50° C. and 450° C. for a period up to 5 minutes. In either of the IBE, plasma sputter etch, or thermal treatment embodiments, an oxygen flow may be added to the noble gas flow during the volatilization step. Step 34v may have a preset endpoint time of duration based on a separate experimental study that establishes a volatilization time for a typical thickness of residue 19x. When Ar plasma sputter etching is selected, RF power is preferably kept at 100 Watts or below to avoid damage to MTJ sidewalls. Preferably, the plasma sputter etch is followed immediately in the same process chamber by an encapsulation process described later.

Figure 6:
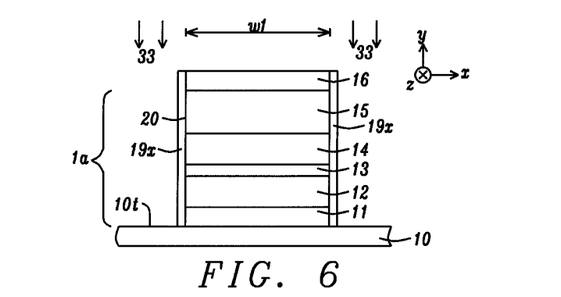
FIG. 6 is a cross-sectional view of the MTJ stack in FIG. 5a or FIG. 5b after a chemical treatment convents non-volatile residue to volatile residue on MTJ sidewalls according to an embodiment of the present disclosure.

The present disclosure also encompasses an embodiment wherein steps 33 and 34v are performed simultaneously following IBE process 32i. In particular, one or more of methanol, ethanol, $NH_3$, CO, and $O_2$ may be introduced into an etch chamber along with a noble gas flow. A thermal treatment may be applied at a temperature between 50° C. and 450° C. while the gas mixture is in the etch chamber. In some embodiments, a plasma is generated with a RF power while the gas mixture is in the chamber and with a temperature in the range of 50° C. to 150° C. Alternatively, a plasma sputter etch may be performed at a temperature proximate to room temperature.

Figure 5B:
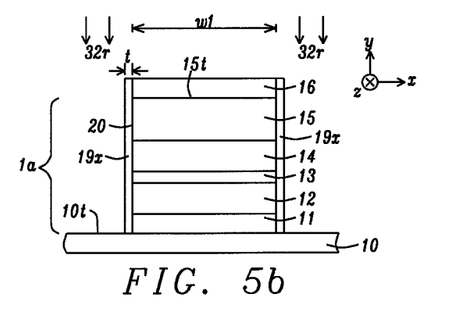
FIG. 5b is a cross-sectional view of the MTJ stack in FIG. 3 after reactive ion etch transfers the hard mask pattern and causes damage and residue to form on MTJ sidewalls.

In a third embodiment that represents a modification of the process flow in the second embodiment, a reactive ion etch 32r shown in FIG. 5b and comprising one or more chemicals including methanol, ethanol, $NH_3$, and CO is inserted either before or after step 32i in FIG. 5a. In this case, chemical treatment 33 may not be necessary since step 32r may oxidize non-volatile residues 19 generated by a preceding IBE process 32i to yield a dead layer having thickness t where t may be <s and comprised of volatile residue 19x on sidewall 20. Volatilization step 34v may be employed after IBE process 32i and RIE 32r to remove any volatile residue that remains on sidewall 20 of MTJ 1a.

In a fourth embodiment, the process flow in the second embodiment is modified such that IBE process 32i is replaced by RIE 32r. Chemical treatment step 33 is usually not necessary since RIE 32r has a tendency to serve the same purpose of oxidizing any non-volatile residue formed on sidewall 20. An optional volatilization step 34v may follow RIE 32r to remove any volatile residue formed on sidewall 20 of MTJ nanopillar 1a.

Figure 8:
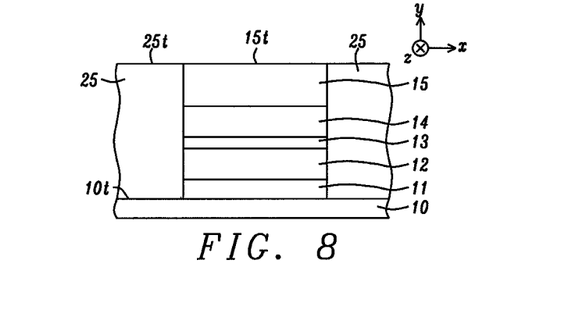
FIG. 8 is a cross-sectional view of the MTJ in FIG. 4 or FIG. 7 following deposition of an encapsulation layer and planarization to electrically isolate the MTJ from adjacent MTJs.

Referring to FIG. 8, an encapsulation layer 25 that is comprised of a dielectric material is deposited over the MTJ array after clean sidewalls 20 are formed according to one of the preceding embodiments. Preferably, the encapsulation layer has a thickness of 5-250 nm and is one or more of a metal oxide, metal oxynitride, metal nitride, metal carbide, SiN, SiON, $SiO_2$, SiC, or SiCN that is deposited immediately after volatilization (in-situ) by physical vapor deposition (PVD), chemical vapor deposition (CVD), ion beam deposition (IBD), or atomic layer deposition (ALD) without breaking the vacuum in the process chamber previously employed for plasma sputter etching in step 34v. In embodiments where a thermal treatment of step 34v is also in-situ, the encapsulation layer is deposited immediately after thermal treatment without breaking the chamber vacuum.

Thereafter, a chemical mechanical polish (CMP) process or another planarization method is performed to form a top surface 25t on the encapsulation layer that is coplanar with top surface 15t on hard mask 15. In some embodiments, the CMP process removes any DARC or BARC layer 16 remaining after etch transfer step 32m, IBE process 32i, or RIE 32r in the previously described embodiments.

Figure 9:
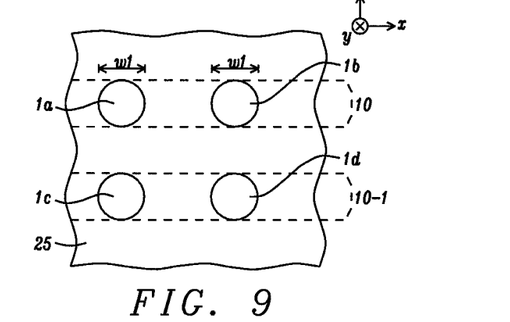
FIG. 9 is a top-down view of a plurality of MTJs having a circular shape in an array of rows and columns according to an embodiment of the present disclosure.

Referring to FIG. 9, the plurality of island shapes of the MTJ nanopillars formed by an etch process or process flow of the present disclosure is depicted from a top-down view after the aforementioned planarization process. MTJ 1a is shown in the same row as MTJ 1b, and MTJs 1c, 1d are in the same column as MTJs 1a and 1b, respectively. As explained previously, the MTJs are depicted with a circular shape but may have elliptical shapes in other embodiments. Generally, millions of MTJs are formed in an array but only four are illustrated here to simplify the drawing.

Thereafter, a top electrode layer comprised of a plurality of parallel conductive lines (not shown) is formed by a conventional method on the MTJs and encapsulation layer 25 as appreciated by those skilled in the art. A first top electrode line may contact a top surface 15t of MTJs 1a, 1c while a second top electrode line contacts top surface 15t in MTJs 1b, 1d. Conductive lines in the top electrode layer are preferably formed along the z-axis direction that is orthogonal to the conductive lines along the x-axis direction in the bottom electrode layer. Therefore, bottom electrode line 10 may contact a bottom surface of both MTJs 1a and 1b while a second bottom electrode line 10-1 contacts the bottom surfaces of MTJs 1c and 1d.

Figure 10:
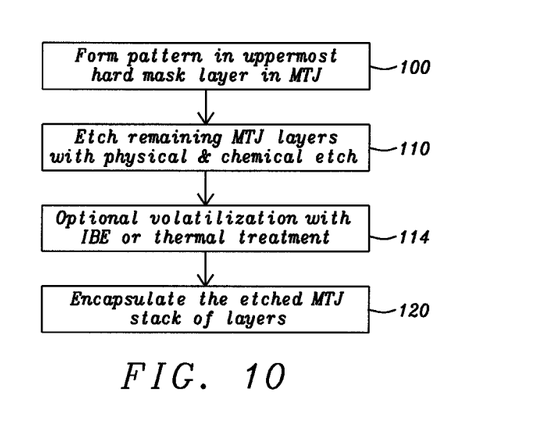
FIG. 10 is a flow diagram showing a sequence of steps of forming a MTJ according to an embodiment of the present disclosure.

Referring to FIG. 10, a flow diagram is provided for the process flow of the first embodiment where a pattern with a CD is formed in the MTJ hard mask layer by an etch process 100 that comprises etch process 30 or both etch processes 30, 31 described previously. In step 110, a combined physical/chemical etch 32m is applied to transfer the pattern through the remaining MTJ layers and thereby form a plurality of MTJs. An optional volatilization step 114 comprising IBE, plasma etching, or a thermal treatment is performed after step 110. Finally, an encapsulation layer is formed around the MTJs in step 120 to electrically isolate the MTJs from each other.

Figure 11:
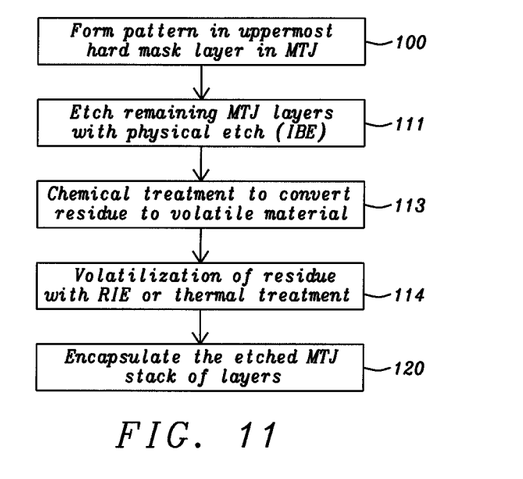
FIGS. 11-12 are flow diagrams showing alternative sequences of forming MTJ sidewalls that have substantially minimized damage and residue according to embodiments of the present disclosure.

In FIG. 11, a flow diagram is depicted for the process flow of the second embodiment of the present disclosure where etch process 100 is followed by a physical (IBE) etch 32i in step 111, a chemical treatment 33 in step 113, volatilization 34v in step 114, and then encapsulation with step 120.

Figure 12:
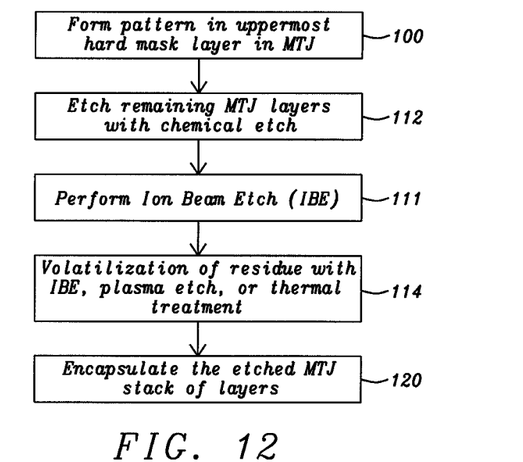

FIG. 12 shows a flow diagram for the process flow of the third embodiment of the present disclosure where etch process 100 is followed by a chemical (RIE) etch 32r in step 112, an IBE process 111, optional volatilization step 114, and finally encapsulation in step 120. In alternative embodiment described previously, IBE process 111 may precede RIE step 112, followed by optional volatilization step 114, and encapsulation step 120.

We have demonstrated the benefits of the combined physical/chemical etch process of the present disclosure with results from an experiment where a series of MTJs with various diameters (w1 in FIG. 9) from 30 nm to 300 nm were fabricated. The etch conditions shown in Table 1 relate to etch step 32m in FIG. 4 in the fabrication sequence where a hard mask pattern is transferred through the underlying MTJ stack of layers using a RIE process with various gas combinations. Otherwise, all other steps in the fabrication sequence including hard mask patterning and encapsulation layer deposition were the same for all samples. The baseline condition (reference) is found in row 6 that features a 90:10 Ar/$CH_3$OH feed ratio previously disclosed in related patent application Ser. No. 15/595,484. A RF power of 1500 Watts(top)/1100 Watts (bottom) was applied to the etch chamber for 33-40 seconds depending on the etch end point detection (EPD) for different conditions in Table 1.

TABLE 1

Gas flow in standard cubic centimeters per minute (sccm) and CH$_3$OH/O$_2$ ratio for MTJ etch using RIE process

| Row | CH$_3$OH (sccm) | Ar (sccm) | O$_2$ (sccm) | % O$_2$ | % CH$_3$OH | % Ar | CH$_3$OH/O$_2$ |
|---|---|---|---|---|---|---|---|
| 1 | 6 | 55.8 | 0.2 | 0.3 | 9.7 | 90.0 | 30.0 |
| 2 | 1.5 | 15.3 | 0.2 | 1.2 | 8.8 | 90.0 | 7.5 |
| 3 | 1.5 | 13 | 0.5 | 3.3 | 10.0 | 86.7 | 3.0 |
| 4 | 1.5 | 12.5 | 1 | 6.7 | 10.0 | 83.3 | 1.5 |
| 5 | 15 | 0 | 0.2 | 1.3 | 98.7 | 0 | 75.0 |
| 6 | 1.5 | 13.5 | 0 | 0 | 10.0 | 90.0 | NA |

The low tail population in a plot of DRR vs. $R_P$ was determined for a plurality of MTJs fabricated using each of the etch conditions shown in rows 1-6 of Table 1. We found that the low tail population decreased for rows 1, 2, and 5 where the CH$_3$OH/O$_2$ ratio is ≥7.5:1 compared with the reference sample in row 6. When the CH$_3$OH/O$_2$ ratio is below 7.5:1 as in rows 3-4, the low tail population either increased or was unchanged compared with the reference sample in row 6. In general, when the CH$_3$OH/O$_2$ ratio falls below 7.5:1 whether a noble gas such as Ar is present or not, MTJ performance is degraded including an increase in low tail population compared with a reference MTJ etch comprised of a 90:10 Ar/CH$_3$OH gas ratio. In preferred embodiments, when Ar, CH$_3$OH, and O$_2$ are all included in the gas mixture for RIE step 32m, the Ar flow rate is substantially larger than the CH$_3$OH flow rate, and the CH$_3$OH flow rate is substantially greater than the O$_2$ flow rate to provide the optimum results in terms of DRR and low tail population.

While this disclosure has been particularly shown and described with reference to, the preferred embodiment thereof, it will be understood by those skilled in the art that various changes in form and details may be made without departing from the spirit and scope of this disclosure.

We claim:

1. A method of etching a magnetic tunnel junction (MTJ) stack of layers, comprising:
    (a) providing a MTJ stack of layers on a first electrode wherein the MTJ stack of layers includes an uppermost hard mask layer, and a first stack of layers comprising a reference layer, a free layer, and a tunnel barrier layer between the reference layer and free layer;
    (b) forming a pattern in the hard mask layer with a first etch process that is an ion beam etch (IBE) with noble gas, or a reactive ion etch (RIE) with a fluorocarbon or chlorocarbon, wherein the pattern has a sidewall that extends from a hard mask top surface to a top surface of the first stack of layers; and
    (c) forming a pattern in the first stack of layers with a sidewall that forms a continuous surface with the sidewall in the hard mask layer, and that extends to a top surface of the first electrode, wherein the pattern in the first stack of layers is produced by a second etch step that comprises ions or plasma generated from oxygen with a first flow rate, and from an oxidant that is one or more chemicals selected from methanol, ethanol, ammonia, N$_2$O, H$_2$O$_2$, H$_2$O, and carbon monoxide having a second flow rate wherein the second flow rate is greater than the first flow rate.

2. The method of claim 1 wherein the second etch step further comprises a flow rate of a noble gas that is one of Ar, Kr, Ne, and Xe.

3. The method of claim 1 further comprised of a volatilization step to remove volatile residue on the first stack sidewall after the second etch step.

4. The method of claim 3 wherein the volatilization step is an IBE or plasma sputter etch comprised of a noble gas and a radio frequency (RF) or direct current (DC) power.

5. The method of claim 4 wherein the IBE or plasma sputter etch during the volatilization step generates inert gas ions or plasma that are directed with a penetration angle between 0° and 90° for IBE, or orthogonal with respect to a top surface of the first electrode for plasma sputter etching.

6. The method of claim 3 wherein the volatilization step is a thermal treatment comprised of a temperature between about 50° C. and 450° C.

7. The method of claim 1 wherein a direction of ions and plasma in the second etch step is essentially orthogonal to the top surface of the first electrode.

8. The method of claim 1 wherein the ions and plasma in the second etch step are generated with a RF power in the range of 600 to 3000 Watts.

9. The method of claim 5 wherein the volatilization step is further comprised of a flow rate of a noble gas, or a flow rate of oxygen and a noble gas.

10. The method of claim 1 wherein the second flow rate is at least 7.5 times greater than the first flow rate.

11. A method of etching a magnetic tunnel junction (MTJ) stack of layers, comprising:
    (a) providing a MTJ stack of layers on a first electrode wherein the MTJ stack of layers includes an uppermost hard mask layer, and a first stack of layers comprising a reference layer, a free layer, and a tunnel barrier layer between the reference layer and free layer;
    (b) forming a pattern in the hard mask layer with a first etch process that is an ion beam etch (IBE) with a noble gas, or a reactive ion etch (RIE) with a fluorocarbon or chlorocarbon, wherein the pattern has a sidewall that extends from a hard mask top surface to a top surface of the first stack of layers; and
    (c) forming a pattern in the first stack of layers with a sidewall that forms a continuous surface with the sidewall in the hard mask layer, and that extends to a top surface of the first electrode, wherein the pattern in the first stack of layers is produced by a process sequence, comprising:
        (1) a first step that is an IBE with a noble gas; and
        (2) a second step that is a chemical treatment to convert a non-volatile residue that is formed on the continuous surface during the first step to a volatile residue.

12. The method of claim 11 further comprised of performing a volatilization step to remove the volatile residue on the continuous surface after the chemical treatment.

13. The method of claim 12 wherein the volatilization step comprises a second IBE or plasma sputter etch step with a noble gas and a RF power less than 100 Watts.

14. The method of claim 12 wherein the volatilization step comprises one or both of a thermal treatment at a temperature between about 50° C. and 450° C., and introduction of oxygen into the chamber.

15. The method of claim 11 wherein the chemical treatment comprises one or more of methanol, ethanol, NH$_3$, and CO.

16. The method of claim 15 wherein the chemical treatment further comprises oxygen.

17. The method of claim 11 wherein the second step further comprises the addition of a noble gas and a temperature in the range of 25° C. to 150° C. to remove the volatile residue.

18. The method of claim 15 wherein the chemical treatment further comprises RIE conditions with a RF power from about 100 to 800 Watts that generate a plasma.

19. A method of etching a magnetic tunnel junction (MTJ) stack of layers, comprising:
  (a) providing a MTJ stack of layers on a first electrode wherein the MTJ stack of layers includes an uppermost hard mask layer, and a first stack of layers comprising a reference layer, a free layer, and a tunnel barrier layer between the reference layer and free layer;
  (b) forming a pattern in the hard mask layer with a first etch process that is an ion beam etch (IBE) with a noble gas, or a reactive ion etch (RIE) with a fluorocarbon or chlorocarbon, wherein the pattern has a sidewall that extends from a hard mask top surface to a top surface of the first stack of layers; and
  (c) forming a pattern in the first stack of layers with a sidewall that forms a continuous surface with the sidewall in the hard mask layer, and that extends to a top surface of the first electrode, wherein the pattern in the first stack of layers is produced by a second etch step with RIE conditions comprising a first flow rate of oxygen, a second flow rate of an oxidant that is one or more of methanol, ethanol, $N_2O$, $H_2O_2$, $H_2O$, ammonia, and carbon monoxide, and a third flow rate of a noble gas wherein the second flow rate is substantially greater than the first flow rate, and the third flow rate is substantially greater than the second flow rate.

20. The method of claim 19 further comprised of performing a volatilization step to remove volatile residue on the first stack sidewall after the second etch step wherein the volatilization step comprises an IBE or plasma sputter etching with a noble gas.

21. The method of claim 19 further comprised of performing a volatilization step after the second etch step wherein the volatilization step comprises a temperature in the range of 50° C. to 450° C.

22. The method of claim 20 wherein the IBE or plasma sputter etching further comprises introduction of oxygen with the noble gas.

* * * * *